(12) United States Patent
Pezzani

(10) Patent No.: US 7,561,408 B2
(45) Date of Patent: Jul. 14, 2009

(54) HF-CONTROLLED SCR-TYPE SWITCH

(75) Inventor: Robert Pezzani, Vouvray (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/727,189

(22) Filed: Dec. 3, 2003

(65) Prior Publication Data

US 2004/0135620 A1    Jul. 15, 2004

(30) Foreign Application Priority Data

Dec. 4, 2002    (FR)    .................... 02 15322

(51) Int. Cl.
*H03K 17/72* (2006.01)
*H03K 17/725* (2006.01)

(52) U.S. Cl. .............. 361/437; 327/428; 327/439; 327/445

(58) Field of Classification Search ........ 361/437, 361/347; 327/428, 439, 445, 453
See application file for complete search history.

(56) References Cited

U.S. PATENT DOCUMENTS

| | | | |
|---|---|---|---|
| 3,344,310 A * | 9/1967 | Nuckolls .................... 315/199 |
| 3,598,889 A * | 8/1971 | Switsen ........................ 84/600 |
| 3,663,950 A | 5/1972 | Bartlett |
| 3,824,444 A * | 7/1974 | Spink ........................... 363/87 |
| 4,296,296 A | 10/1981 | Eichelberger et al. |
| 4,389,691 A | 6/1983 | Hancock |
| 4,459,531 A * | 7/1984 | Dumont et al. ............. 318/756 |
| 4,630,092 A * | 12/1986 | Bhagat ....................... 257/135 |
| 4,649,414 A * | 3/1987 | Ueda et al. .................. 257/137 |
| 4,713,723 A | 12/1987 | Kaufman |
| 4,760,432 A | 7/1988 | Stoisiek et al. |
| 4,779,036 A * | 10/1988 | Shinoda ...................... 323/236 |
| 4,982,259 A * | 1/1991 | Yakushiji et al. ............ 257/140 |
| 5,546,038 A * | 8/1996 | Croft .......................... 327/310 |
| 6,091,087 A * | 7/2000 | Iwamuro et al. ............ 257/133 |
| 2002/0066904 A1* | 6/2002 | Yuan et al. .................... 257/83 |

OTHER PUBLICATIONS

R. Boylestad, Electronic Devices and Circuit Theory, 1987, 4th Edition, pp. 30-31.*
Hui et al., Coreless Printed Circuit Board Transformers for Power MOSFET-IGBT Gate Dive Circuits, 1999, IEEE Transactions on Power Electronics, vol. 14, No. 3, pp. 422-430.*
French Search Report from French Patent Application 02/15322, filed Dec. 4, 2002.

* cited by examiner

*Primary Examiner*—Stephen W Jackson
*Assistant Examiner*—Zeev Kitov
(74) *Attorney, Agent, or Firm*—Lisa K. Jorgenson; James H. Morris; Wolf, Greenfield & Sacks, P.C.

(57) ABSTRACT

A method for controlling an SCR-type switch, comprising applying to the switch gate several periods of an unrectified high-frequency voltage, the power of one HF halfwave being insufficient to start the SCR-type switch.

43 Claims, 2 Drawing Sheets

HF-CONTROLLED SCR-TYPE SWITCH

BACKGROUND OF THE INVENTION

1. Field of the Invention

The present invention generally relates to the control of SCR-type switches. The term "SCR-type switches" is here used to designate components such as thyristors, triacs, and controlled bidirectional switches of various types comprising four or five alternated semiconductor layers. The present invention especially applies to the case where the switches are medium-power switches intended to switch loads connected to the A.C. supply network (at 50 or 60 Hz).

2. Discussion of the Related Art

Generally, in the control of multiple switches and/or of switches supplied by the A.C. network, the problem of the isolation between the control circuit and the switch(es) to be controlled is posed, and a galvanic isolation circuit such as a transformer or an optocoupler is generally provided, which has the disadvantage of being expensive and difficult to integrate.

It has been provided, for example, in PCT patent application WO/0250850 which is incorporated herein by reference, to control power switches with high-frequency signals. In this patent application, the high frequency is used for the advantage that it has of enabling use of a small transformer, which enables galvanic isolation at lesser cost but however requires a transformer. After transformation, this high frequency is applied to the gate of the component to be switched via a rectifying diode, that is, in fact, the control is performed by signals in the form of D.C. pulses.

SUMMARY OF THE INVENTION

The present invention provides a novel SCR-type switch control method.

More specifically, the present invention provides such a method and an adapted device, especially enabling solving in a particularly simple fashion the problem of the isolation between the control circuit and the switch to be controlled.

To achieve these and other objects, the present invention provides a method for controlling an SCR-type switch, comprising applying to the switch gate several periods of an unrectified high-frequency voltage, the power of an HF half-wave being insufficient to start the SCR-type switch.

According to an embodiment of the present invention, the HF voltage oscillates at a selected frequency between 10 kHz and a few GHz.

According to an embodiment of the present invention, the high frequency is applied via an insulating layer formed above a sensitive area of the component.

According to an embodiment of the present invention, the high frequency is applied above a gate region of a thyristor.

According to an embodiment of the present invention, the high frequency is applied above a gate region of a triac.

According to an embodiment of the present invention, the high frequency is applied via a high-frequency line.

According to an embodiment of the present invention, the high frequency is applied via a winding.

The present invention also provides an SCR-type switch component, comprising two main electrodes and at least one control electrode formed on an insulating layer and arranged above a starting region of the component, said control electrode being intended to be connected to an unrectified HF power supply.

According to an embodiment of the present invention, the control electrode is arranged above a gate region of a thyristor.

According to an embodiment of the present invention, the control electrode is arranged above a gate region of a triac.

According to an embodiment of the present invention, the control electrode is a high-frequency line.

According to an embodiment of the present invention, the high frequency is applied via a winding.

According to an advantage of the present invention, the application of an HF signal in the control area of an SCR-type component may be performed without needed metallization to be in contact with the sensitive semiconductor area, which simplifies the design and structure of the switch and solves all the isolation and reference problems which are generally posed upon control by a same control circuit of various thyristors and/or triacs, or other bidirectional switches.

The foregoing objects, features, and advantages of the present invention will be discussed in detail in the following non-limiting description of specific embodiments in connection with the accompanying drawings.

DETAILED DESCRIPTION

FIGS. 4, 5, 6A, and 7 are partial simplified cross-section views and are only intended to simplify the understanding of the following description. Especially, for simplification, some elements have been shown in a same cross-section plane while they are in fact in different planes. It will be within the abilities of those skilled in the art to form practical devices, using known techniques. Further, as usual in the field of semiconductor component representation, the dimensions of the various layers and regions are not drawn to scale.

The basic idea of the present invention is to directly control an SCR-type switch with an unrectified HF voltage. It should be noted that this approach differs from conventional SCR-type switch control modes according to which a D.C. voltage or voltage pulse is applied on the gate electrode, connected to a gate area of this component. In the case where a voltage pulse is applied, said pulse must be of sufficient amplitude to turn on a junction and of sufficient intensity to have a sufficient current flow through this junction. In other words, the pulse must have a given minimum power.

A priori, when an A.C. signal is applied to the gate of a thyristor such that the power of each halfwave is insufficient to turn on the thyristor and that the duration of each halfwave is shorter than the component priming time, the effect of positive and negative halfwaves annuls and the A.C. signal has no switch starting effect.

Figure 1:
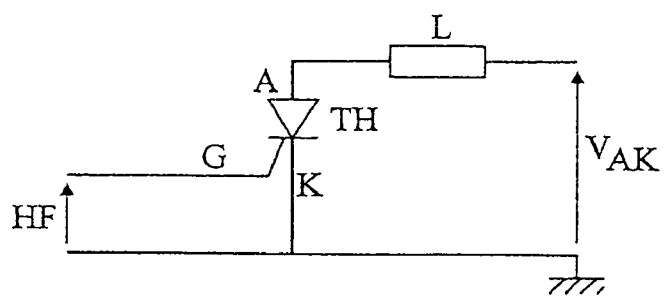
FIG. 1 shows a principle diagram of the control of a thyristor.

The applicant has however tried the experiment in a circuit of the type in FIG. 1, in which an HF signal is applied between gate G and cathode A of a thyristor. A D.C voltage VAK of appropriate biasing is applied across the series assembly of a load L and of thyristor TH. It is considered that cathode K of the thyristor is grounded.

Figure 2:
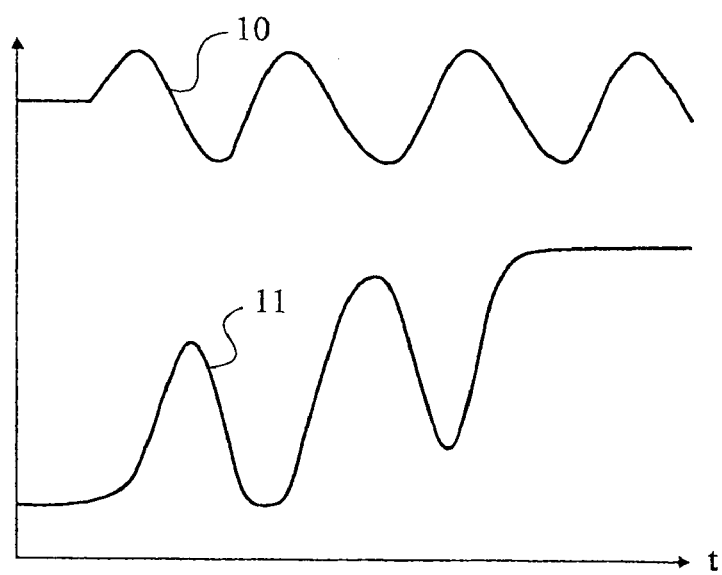
FIG. 2 shows the shape of the current settling in a thyristor for an A.C. voltage applied at a 1-MHz frequency.

In FIG. 2, an HF voltage at a frequency of approximately 1 megahertz applied between the gate and the cathode has been shown by a curve 10 and the observed anode current has been shown by a curve 11. It should be noted that, after approximately three halfwaves of the high-frequency A.C. voltage, the thyristor conduction settles. Then, as conventional with a thyristor, the HF power supply can be interrupted and the thyristor remains conductive.

Figure 3:
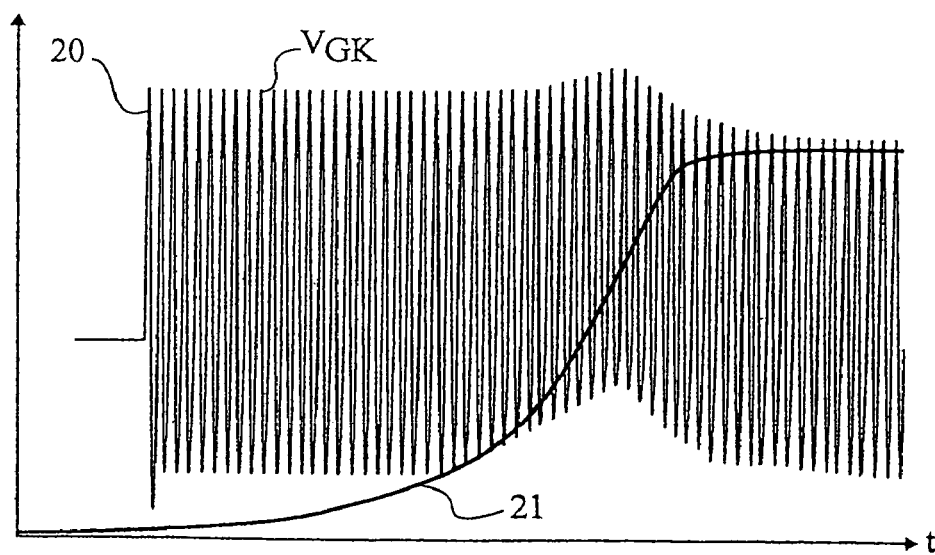
FIG. 3 shows the shape of the current settling in a thyristor controlled by an A.C. signal at a frequency on the order of 20 MHz.

FIG. 3 shows two similar curves for an A.C. voltage at a frequency on the order of 20 MHz. More specifically, in FIG. 3, curve 20 shows the gate/cathode voltage and curve 21 shows the anode current. It can be seen that the anode current progressively increases before settling at a sufficient value for the switch to remain on if the high-frequency voltage is interrupted. The settling duration of the conduction extends over from approximately 40 to 50 high-frequency periods.

Thus, unexpectedly, when a high-frequency control voltage is applied to the gate of a thyristor, and more generally of an SCR-type switch, said switch is switched on while each halfwave of the A.C. voltage has a power and/or a duration insufficient to ensure the switching of the considered SCR-type component.

A significant advantage of the high-frequency control is that the high-frequency voltage may be applied to the gate terminal via a coupling capacitor which exhibits a very small impedance for high frequencies and which blocks the D.C. voltage or even the A.C. voltage at the network frequency (50 or 60 hertz), to which are generally connected the control terminals of a mono- or bidirectional switch. The possibility of inserting such a coupling capacitor results in that problems to be generally overcome of isolation of the control circuit with respect to the main circuit of a power switch are simply solved.

The present invention also provides various SCR switch structures capable of implementing the present invention.

A common point of these various structures is that, as usual, the main electrodes of the power switching component are normally connected to appropriate conductive areas, but that no gate metallization is provided any longer in contact with the semiconductor gate area. Instead of this gate contact, various means are provided to inject an HF signal via an insulating layer towards a starting area of the power component. In other words, a capacitive coupling is performed through the insulating layer towards a sensitive area of the semiconductor component. The insulating layer may be one of the silicon oxide layers currently used in silicon semiconductor components.

Figure 4:
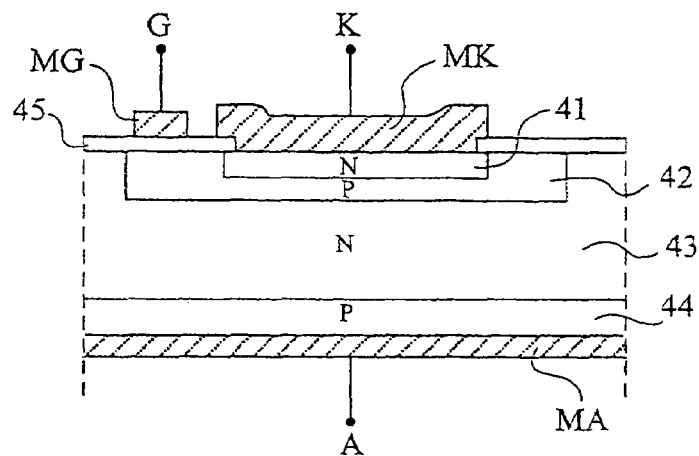
FIGS. 4, 5, 6A, and 7 show various examples of implementation of the present invention, FIG. 6B being an equivalent diagram of the embodiment of FIG. 6A.

FIG. 4 shows an example of an HF-controlled thyristor according to the present invention. This component of vertical type conventionally comprises an N-type cathode region 41, formed in a P-type well 42, itself formed in a lightly-doped N-type layer 43, a P-type anode region 44 being present on the rear surface side of the component. N-type region 41 is in contact with a cathode metallization MK and is connected to a cathode terminal K. The rear surface of the component is coated with an anode metallization MA and is connected to an anode terminal A. It should be recalled that, conventionally, a gate terminal is formed by a metallization in contact with a portion of layer 42. According to the present invention, region 42 is uniformly coated with an insulating layer 45 above which is formed a metallization MG to which it is provided to issue a high-frequency starting signal. It will again be underlined that metallization MG is completely insulated with respect to the main thyristor circuit. The HF frequency may be applied between terminal G and one or the other of terminals A and K which, being at set voltages, are considered as grounds from the viewpoint of high frequencies.

Figure 5:
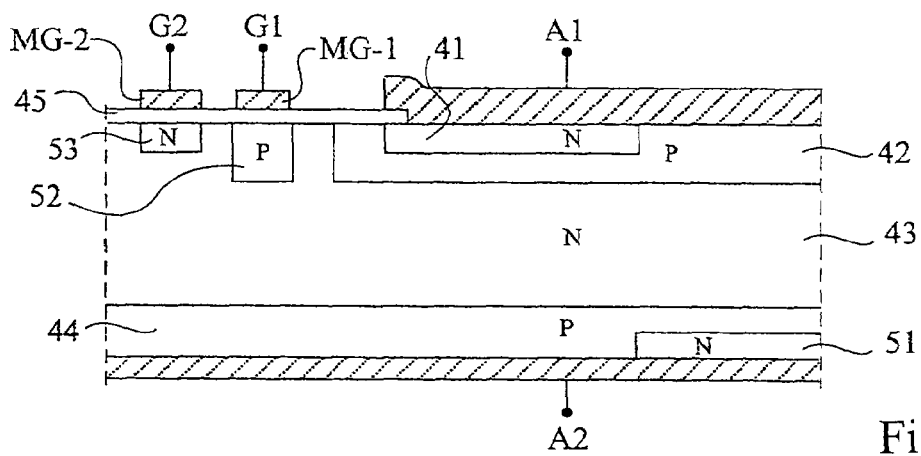

FIG. 5 shows an application of the present invention to the control of a triac. This triac comprises the same layers 41 to 44 as those previously described for the thyristor of FIG. 4. In rear surface P-type layer 44 is further formed an N-type region 51 in contact with the rear surface metallization and, conventionally, a P-type region 52 is formed on the front surface side in N-type region 43, corresponding to a gate region. Preferably, a more heavily-doped N-type region 53 is provided in the vicinity of region 52. Metallizations MG1 and MG2 are respectively formed above P-type region 52 and N-type region 53. A high-frequency signal may for example be applied between terminals G1 and G2 connected to metallizations MG1 and MG2 and it can be acknowledged that this starts the triac in the same way as the thyristor was previously started. It should be noted that terminal G2 is optional and that an HF control signal could be applied on terminal G1 only. A starting of the triac is then also acknowledged.

Figure 6A:
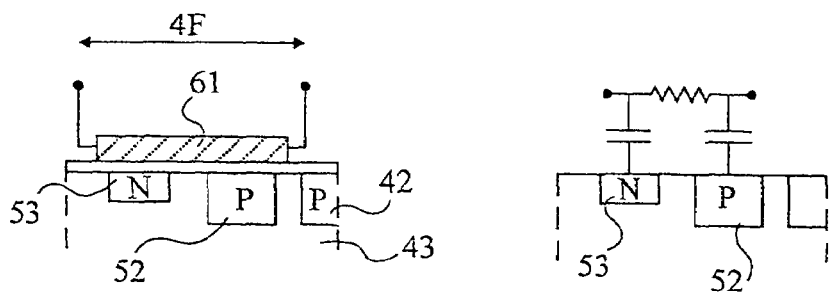
Figure 6B:
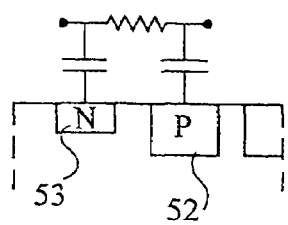

FIG. 6A shows an alternative embodiment of the structure shown in FIG. 5. Instead of providing two metallizations MG1 and MG2 between which a high-frequency signal is applied, a high-frequency line 61, between the terminals of which a high-frequency voltage HF is applied, is provided above regions 52 and 53. Again, by capacitive coupling, as illustrated in FIG. 6B, a current starts flowing in the underlying layers and it can be acknowledged that this results in a turning-on of the main component.

Figure 7:
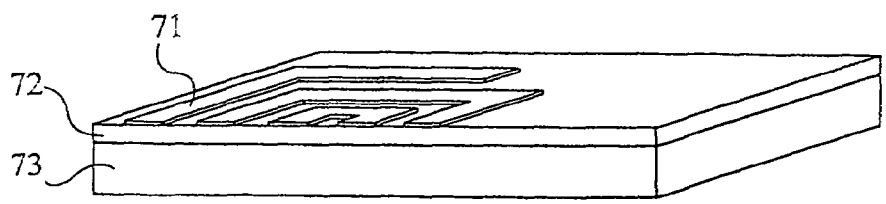

According to another alternative of the present invention, as schematically illustrated in FIG. 7, the high frequency may be applied to a sensitive area of the switch via a winding 71 formed on an insulating layer 72 coating substrate 73 in which is formed the power component, as illustrated in FIG. 4 or 5. Various applications of such an HF injection by a coil may be used. A secondary winding may be formed in the semiconductor, for example from a diffused layer or an area filled with a conductive material such as polysilicon formed in insulated grooves formed in a portion of the semiconductor substrate, the HF being then present at the ends of the secondary winding. It can also be provided for winding 71 to generate a magnetic field which creates in the conductive material eddy currents turning on sensitive junctions as indicated previously. In such an application, the frequencies can be very high, on the order of from several megahertz to several gigahertz.

It should be understood that the present invention is likely to have various alterations and modifications, the base of the present invention being a control by a high-frequency signal of a semiconductor component by high frequency injection in a sensitive area of this semiconductor component. This sensitive area may be distinct from the conventional gate areas of SCR-type components; it is enough for it to cause the turning-on of a junction which generates charges in the vicinity of the blocking junction of properly-biased SCR-type component. The high-frequency range will be adapted to the context of the application. High frequencies within a range from 10 kHz to several GHz may for example be envisaged according to the application. As indicated previously, each of the high-frequency halfwaves does not need be very energetic since, as shown in relation with FIGS. 2 and 3, an accumulation phenomenon which causes a progressive starting of the controlled semiconductor component occurs.

Further, although the present invention has been described in relation with simplified examples of specific thyristors and triacs, it applies to any SCR-type component and in particular to any type of bidirectional component.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for controlling an SCR-type switch, comprising applying to a switch gate of the SCR-type switch several periods of an unrectified high frequency voltage in succession, such that an accumulated effect on the SCR-type switch of applying the several periods in succession is to start the SCR-type switch, a power of each halfwave of the several periods being individually insufficient to start the SCR-type switch.

2. The method of claim 1, wherein the high frequency voltage oscillates at a selected frequency between 10 kHz and a few GHz.

3. The method of claim 1, wherein the high frequency voltage is applied via an insulating layer formed above a staffing area of the component.

4. The method of claim 3, wherein the high frequency voltage is applied above a gate region of a thyristor.

5. The method of claim 3, wherein the high frequency voltage is applied above a gate region of a triac.

6. The method of claim 3, wherein the high frequency voltage is applied via a high-frequency line having terminals for connection to the high frequency voltage.

7. The method of claim 3, wherein the high frequency voltage is applied via a winding that generates a magnetic field or responds to a magnetic field.

8. An SCR-type switch component, comprising two main electrodes and at least one control electrode formed on an insulating layer that insulates the control electrode from a starting region of the component, said control electrode controlling the SCR-type switch component in response to an unrectified high frequency power supply that supplies several periods of an unrectified high frequency voltage in succession, wherein the SCR-type switch component is configured such that the SCR-type switch component is not turned on in response to an individual one of the several periods, wherein the SCR-type component is configured such that an accumulated effect of applying the several periods in succession causes the SCR-type switch to turn on.

9. The SCR-type switch component of claim 8, wherein the control electrode is arranged above a gate region of a thyristor.

10. The SCR-type switch component of claim 8, wherein the control electrode is arranged above a gate region of a triac.

11. The SCR-type switch component of claim 8, wherein the control electrode is a high-frequency line having terminals for connection to the high frequency power supply.

12. The SCR-type switch component of claim 8, wherein the high frequency is applied via a winding that generates a magnetic field or responds to a magnetic field.

13. A method of controlling an SCR-type switch, the method comprising:
providing, to a control terminal of the SCR-type switch, a high-frequency control voltage that controls the SCR-type switch without supplying current from the control terminal to a starting area of the SCR-type switch, wherein the high-frequency control voltage comprises a plurality of halfwaves, wherein the SCR-type switch is turned on in response to an accumulated effect of the plurality of halfwaves, an individual one of the plurality of halfwaves being of insufficient intensity and/or duration to start the switch by itself 14. The method of claim 13, wherein the high frequency voltage oscillates at a frequency that is between 10 kHz and a few GHz.

15. The method of claim 13, wherein the high frequency voltage oscillates at a frequency of 1 MHz or higher.

16. The method of claim 13, wherein the high frequency control voltage is provided to the control terminal through a capacitor.

17. The method of claim 13, wherein the control terminal is insulated from the starting area.

18. The method of claim 13, wherein the high-frequency control voltage comprises a plurality of halfwaves, wherein each one of the plurality of halfwaves is individually insufficient to turn on the SCR-type switch.

19. The method of claim 18, wherein a power of each one of the plurality of halfwaves is individually insufficient to turn on the SCR-type switch.

20. The method of claim 18, wherein a voltage of each one of the plurality of halfwaves is individually insufficient to turn on the SCR-type switch.

21. The method of claim 18, wherein a duration of each one of the plurality of halfwaves is individually insufficient to turn on the SCR-type switch.

22. The method of claim 13, wherein the high-frequency control voltage is unrectified.

23. The method of claim 13, wherein the high-frequency control voltage is applied via a winding that generates a magnetic field or responds to a magnetic field.

24. A method of controlling an SCR-type switch, the method comprising:
providing a high frequency control signal to a gate of the SCR-type switch that controls the SCR-type switch, the high frequency control signal having a frequency of 1 MHz or higher, wherein a duration of a single halfwave of the high frequency control signal is insufficient for the single halfwave to turn on the SCR-type switch;
wherein the control signal is provided to the gate through a capacitor.

25. An method of controlling an SCR-type switch, the method comprising:
providing a high-frequency control voltage to a gate of the SCR-type switch that controls the SCR-type switch;
wherein the SCR-type switch is turned on in response to an accumulated effect of a plurality of halfwaves of the high-frequency control voltage but is not turned on in response to an effect of an individual one of the plurality of halfwaves.

26. An SCR-type switch, comprising:
a starting region;
an insulating region; and
a first control electrode that is insulated from the starting region by the insulating region; wherein the SCR-type switch is controlled by applying a high-frequency control voltage to the control electrode;
wherein the SCR-type switch is turned on in response to an accumulated effect of a plurality of halfwaves of the high-frequency control voltage.

27. The SCR-type switch of claim 26, wherein the first control electrode is completely insulated from the starting region.

28. The SCR-type switch of claim 26, wherein the first control electrode is inductively coupled to the starting region via the insulating region.

29. The SCR-type switch of claim 26, wherein the first control electrode is capacitively coupled to the starting region via the insulating region.

30. The SCR-type switch of claim 29, wherein the first control electrode contacts the insulating region.

31. The SCR-type switch of claim 30, wherein the insulating region contacts the starting region.

32. The SCR-type switch of claim 26, wherein the first control electrode is insulated, via the insulating layer, from a semiconductor substrate in which semiconductor layers of the SCR-type switch component are formed.

33. The SCR-type switch of claim 26, further comprising:
a second control electrode that is insulated from the starting region by the insulating region.

34. The SCR-type switch of claim 33, wherein the starting region comprises a first region of a first conductivity type and a second region of a second conductivity type, wherein the first control electrode is closer to the first region than to the second region, and wherein the second control electrode is closer to the second region than to the first region.

35. The SCR-type switch of claim 26, wherein the first control electrode contacts the insulating region.

36. The SCR-type switch of claim 26, wherein the insulating region contacts the starting region.

37. The SCR-type switch of claim 26, wherein the SCR-type switch is a triac.

38. The SCR-type switch of claim 26, wherein the SCR-type switch is a thyristor.

39. The SCR-type switch of claim 26, wherein the effect of the plurality of halfwaves of the high-frequency control voltage being applied to the control electrode close enough in time and large enough in intensity such that the accumulated effect of the plurality of halfwaves gradually increases over time and thereby turns on the SCR-type switch, wherein the SCR-type switch is not turned on in response to an effect of an individual one of the plurality of halfwaves applied by itself.

40. The SCR-type switch of claim 26, wherein the high-frequency control voltage oscillates at a frequency of 1 MHz or higher.

41. The SCR-type switch of claim 26, wherein the high-frequency control voltage controls the SCR-type switch without supplying current from the control terminal to the starting area.

42. The method of claim 24, wherein providing, to the gate of the SCR-type switch, a plurality of halfwaves of the high frequency voltage in succession turns on the SCR-type switch.

43. The method of claim 42, wherein providing the plurality of halfwaves of the high frequency voltage in succession creates an accumulated effect at a starting area of the SCR-type switch that is sufficient to turn on the SCR-type switch.

* * * * *